(12) United States Patent
Wojtunik (10) Patent No.: US 10,637,602 B2
(45) Date of Patent: Apr. 28, 2020

(54) METHOD, APPARATUS AND SYSTEM TO AMPLIFY AND TRANSPORT ANALOG SIGNALS

(71) Applicant: SAFE-COM WIRELESS, Holmdel, NJ (US)

(72) Inventor: Henry Wojtunik, Holmdel, NJ (US)

( * ) Notice: Subject to any disclaimer, the term of this patent is extended or adjusted under 35 U.S.C. 154(b) by 0 days.

(21) Appl. No.: 16/317,607

(22) PCT Filed: Jul. 13, 2017

(86) PCT No.: PCT/US2017/041844
§ 371 (c)(1),
(2) Date: Jan. 14, 2019

(87) PCT Pub. No.: WO2018/013756
PCT Pub. Date: Jan. 18, 2018

(65) Prior Publication Data
US 2019/0288785 A1    Sep. 19, 2019

Related U.S. Application Data

(60) Provisional application No. 62/362,977, filed on Jul. 15, 2016.

(51) Int. Cl.
| | |
|---|---|
| *H04J 14/02* | (2006.01) |
| *H04B 7/185* | (2006.01) |
| *H04B 10/00* | (2013.01) |
| *H04B 10/25* | (2013.01) |
| *H04N 7/22* | (2006.01) |
| *H03F 3/195* | (2006.01) |

(Continued)

(52) U.S. Cl.
CPC .............. *H04J 14/02* (2013.01); *H04B 7/185* (2013.01); *H04B 10/12* (2013.01); *H04B 10/25* (2013.01); *H04N 7/22* (2013.01); *H03F 3/195* (2013.01); *H04B 10/118* (2013.01); *H04B 10/2575* (2013.01)

(58) Field of Classification Search
CPC ...... H04J 14/02; H04J 14/0298; H04B 7/185; H04B 10/12; H04B 10/25; H04B 1/10; H04B 10/25751; H04B 10/2575; H04B 10/118; H04B 7/18506; H04N 7/22; H04L 25/03; H04L 27/14; H04L 25/03006; H04L 7/02; H04L 7/0029; H01Q 1/246; H01Q 3/2605; H01Q 3/2611; H01Q 3/267; H03F 3/195; H04W 84/06
USPC .......................................................... 398/48
See application file for complete search history.

(56) References Cited

U.S. PATENT DOCUMENTS

| | | | | |
|---|---|---|---|---|
| 5,430,568 A | * | 7/1995 | Little ................. | H04B 10/2525 398/81 |
| 5,612,975 A | * | 3/1997 | Becker ................ | H04L 7/0029 329/308 |

(Continued)

*Primary Examiner* — Abbas H Alagheband
(74) *Attorney, Agent, or Firm* — Volpe and Koenig PC (57) ABSTRACT

A system and method for improving for amplifying a multi-frequency radio signal by using high efficiency amplifiers to amplify one radio frequency carrier at a time. The system further improves performance by providing parallel communication pathways throughout the entire transport and distribution chain. By creating parallel processing paths, both optically and electrically, the interaction of multiple signals are limited thereby avoiding unwanted intermodulation and noise.

20 Claims, 12 Drawing Sheets

(51) Int. Cl.
    *H04B 10/2575* (2013.01)
    *H04B 10/118* (2013.01)

(56) References Cited

U.S. PATENT DOCUMENTS

| | | | | |
|---|---|---|---|---|
| 5,987,303 | A * | 11/1999 | Dutta | H04B 10/25751 348/E7.094 |
| 6,016,426 | A * | 1/2000 | Bodell | H04B 10/25759 455/422.1 |
| 6,337,660 | B1 * | 1/2002 | Esman | H01Q 3/2676 342/375 |
| 8,260,143 | B2 * | 9/2012 | Gupta | H04L 27/2096 398/115 |
| 8,855,489 | B2 * | 10/2014 | Boldi | H04J 14/0226 14/226 |
| 8,909,057 | B2 * | 12/2014 | Sun | H04B 10/2575 398/115 |
| 9,667,199 | B1 * | 5/2017 | McLaren | H03F 1/0288 |
| 10,320,481 | B2 * | 6/2019 | Wang | H04B 10/118 |
| 2002/0080448 | A1 * | 6/2002 | Kim | H04B 10/25753 398/115 |
| 2004/0132474 | A1 * | 7/2004 | Wala | H04B 10/25754 455/517 |
| 2006/0079290 | A1 * | 4/2006 | Seto | H01Q 3/2605 455/562.1 |
| 2007/0127468 | A1 * | 6/2007 | Choi | H04L 12/2801 370/389 |
| 2015/0188622 | A1 * | 7/2015 | Leabman | H01Q 1/246 370/316 |
| 2016/0134439 | A1 * | 5/2016 | Harel | H04L 25/03006 375/334 |
| 2018/0019808 | A1 * | 1/2018 | Hreha | H04B 7/18521 |
| 2018/0019809 | A1 * | 1/2018 | Hreha | H04B 7/18521 |

\* cited by examiner

METHOD, APPARATUS AND SYSTEM TO AMPLIFY AND TRANSPORT ANALOG SIGNALS

CROSS REFERENCE TO RELATED APPLICATION(S)

This application claims the benefit of U.S. provisional application No. 62/362,977 and filing date Jul. 15, 2016, which is incorporated by reference as if fully set forth.

FIELD OF INVENTION

The field of invention is communication systems and more specifically to amplify and transport communication signals in a wireless communication system.

BACKGROUND

Radio Frequency (RF) active components such as amplifiers and passive components generate harmonics, intermodulation, spurious signals and noise. Passing multiple frequencies simultaneously through active components adds additional noise which reduces the signal-to-noise ratio (SNR) performance. Passing multiple frequencies simultaneously through active components also generates distortion and unwanted spurious signals due to the non-linearity of the device. This reduces the signal to noise and distortion (SINAD) performance. These unwanted signals can interfere, distort and otherwise detrimentally impact the clear transmission and amplification of communication signals used in communication systems.

In the case of wireless communication systems, the unwanted signals are radiated into the free-space causing interference and a noise build-up for other wireless systems operating near the noisy transmitter and or near the same frequency bands. The amount of noise and spurious signal permitted to be emitted is tightly regulated by the Federal Communications Commission (FCC) in the United States and comparable agencies in other countries. The FCC has recently further reduced the spurious signal level permitted to be transmitted by a radiating system making it even more difficult to amplify and transport a compliant signal meeting the FCC's standards.

In addition, multicarrier amplifiers are inefficient in their conversion of power from DC to RF. To reduce the intermodulation requires higher powered amplifiers that further add to the inefficient power consumption.

Furthermore, the invention has a positive impact on system reliability. The fact that a single amplifier is used to amplify multiple signals, when a single multicarrier amplifier fails, all the signals in the system are lost and unusable creating a risk to first responder users. A single multicarrier amplifier creates a single point of failure highly undesirable for the first responder users who are relying on the system for their communication during an emergency incident.

SUMMARY

Embodiments of the present invention improve the power efficiency by utilizing high efficiency amplifiers that amply one RF carrier at a time. In these configurations, each amplifier is dedicated to amplifying a single carrier and improves the DC to RF power conversion efficiency. Embodiments of the present invention also improve SINAD performance by providing parallel communication pathways throughout the entire transport and distribution chain. By creating parallel processing paths, both optically and electrically, the interaction of multiple signals are limited, thereby never generating the unwanted intermodulation and noise. In some embodiments, a digital signal processor can be used to filter and separate the multitude of frequencies and, after digital filtering and processing, convert them back to the analog (radio frequency) domain with individual analog-to-digital converters and amplifying the individual frequencies with individual amplifiers dedicated and optimized to amplify one frequency. In the embodiments, the intermodulation commonly associated with multi-carrier amplifiers can be avoided and the signals are amplified without generating significant intermodulation or noise. This may permit the use of efficient single frequency amplification and reduce the power consumption and/or battery use in the case of battery powered applications.

DETAILED DESCRIPTION OF THE PREFERRED EMBODIMENT(S)

Figure 1A:
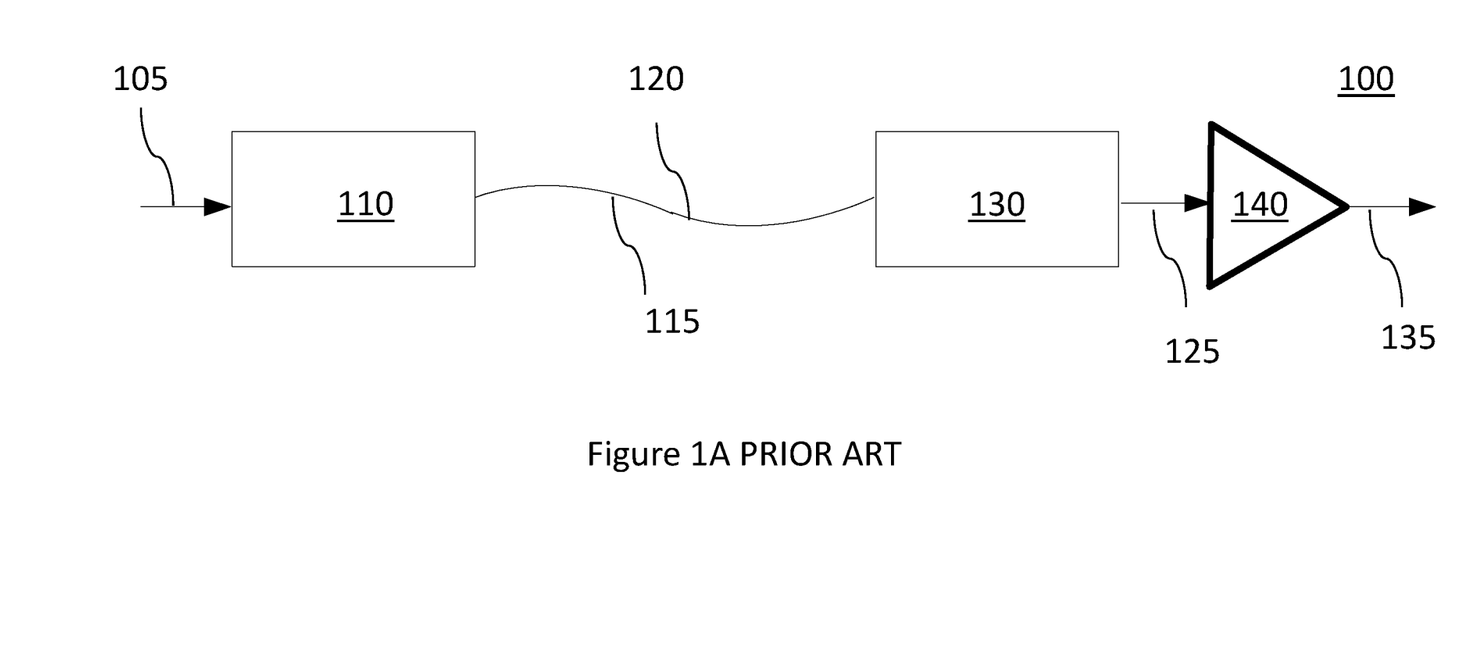
FIG. 1A is a block diagram of a prior art transport and amplification system.
Figure 1B:
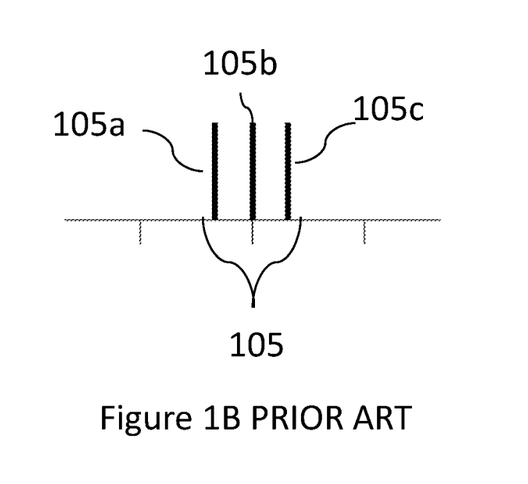
FIG. 1B is a spectral graph of an example multi-frequency input signal.

FIG. 1A depicts a prior art transport and amplification system 100. In the prior art transport and amplification system 100, a Fiber Optic Transmitter 110 receives a multi-frequency Radio Frequency (RF) input signal 105. A spectral graph of the multi-frequency RF input signal 105 is shown in FIG. 1B. The multi-frequency RF input signal 105 includes a plurality of signals modulated at discrete frequencies (105A, 105B and 105C). Although three frequencies are depicted, a person of ordinary skill in the art would appreciate that any number of frequencies may be used. The Fiber Optic Transmitter 110 then transmits an optical signal 115 over a Fiber Optic Cable 120 to a Fiber Optic Receiver 130. The Fiber Optic Receiver 130 receives the optical signal 115 and transmits an RF signal 125 to a multi-frequency amplifier 140. The multi-frequency amplifier 140 amplifies the RF signal 125 to generate amplified RF signal 135.

Figure 1C:
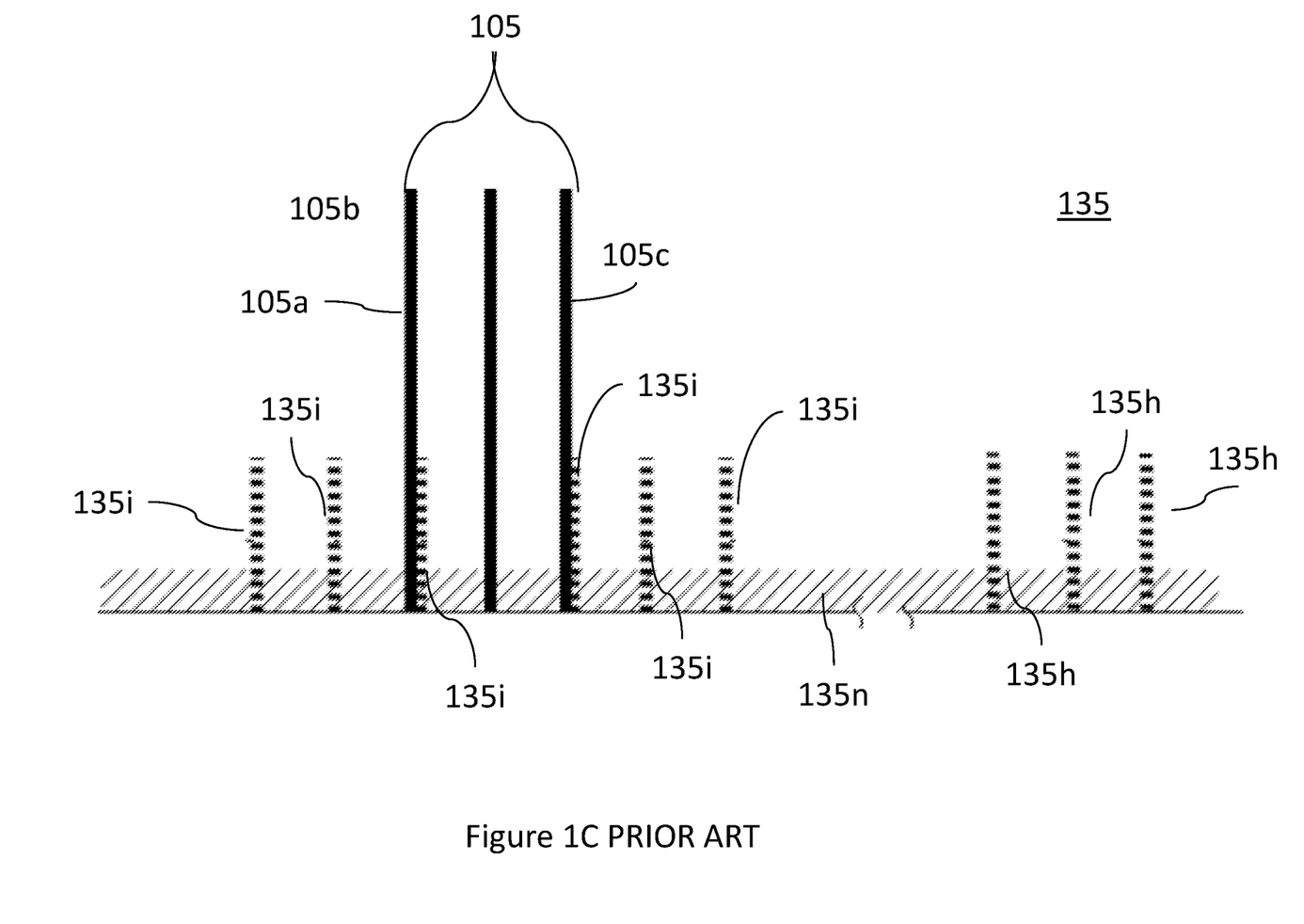
FIG. 1C is a spectral graph of an example output of the prior art transport and application system.

A spectral graph of the amplified RF signal 135 is shown in FIG. 1C. The amplified RF signal 135 includes a combination of the multi-frequency RF input signal 105, intermodulation distortions 135i, harmonic distortions 135h, and additional noise 135n. The intermodulation distortions 135i are the result of the amplitude modulation of the multi-frequency RF input signal 105 containing the plurality of different frequencies (105a, 105b and 105c) caused by nonlinearities in transport and amplification system 100. The intermodulation between each frequency component (e.g. 105a, 105b and 105c) will form additional signals at frequencies that are not just at harmonic frequencies (integer multiples) of either, like harmonic distortion (135h), but also at the sum and difference frequencies of the original frequencies and at multiples of those sum and difference frequencies. The additional noise 135n is the result of noise generated by the power amplifier and further stimulated within the power amplifier by the injection of the multicarrier signals. These unwanted signals may interfere, distort and otherwise detrimentally impact the clear transmission and amplification of multi-frequency RF input signal 105.

Figure 2A:
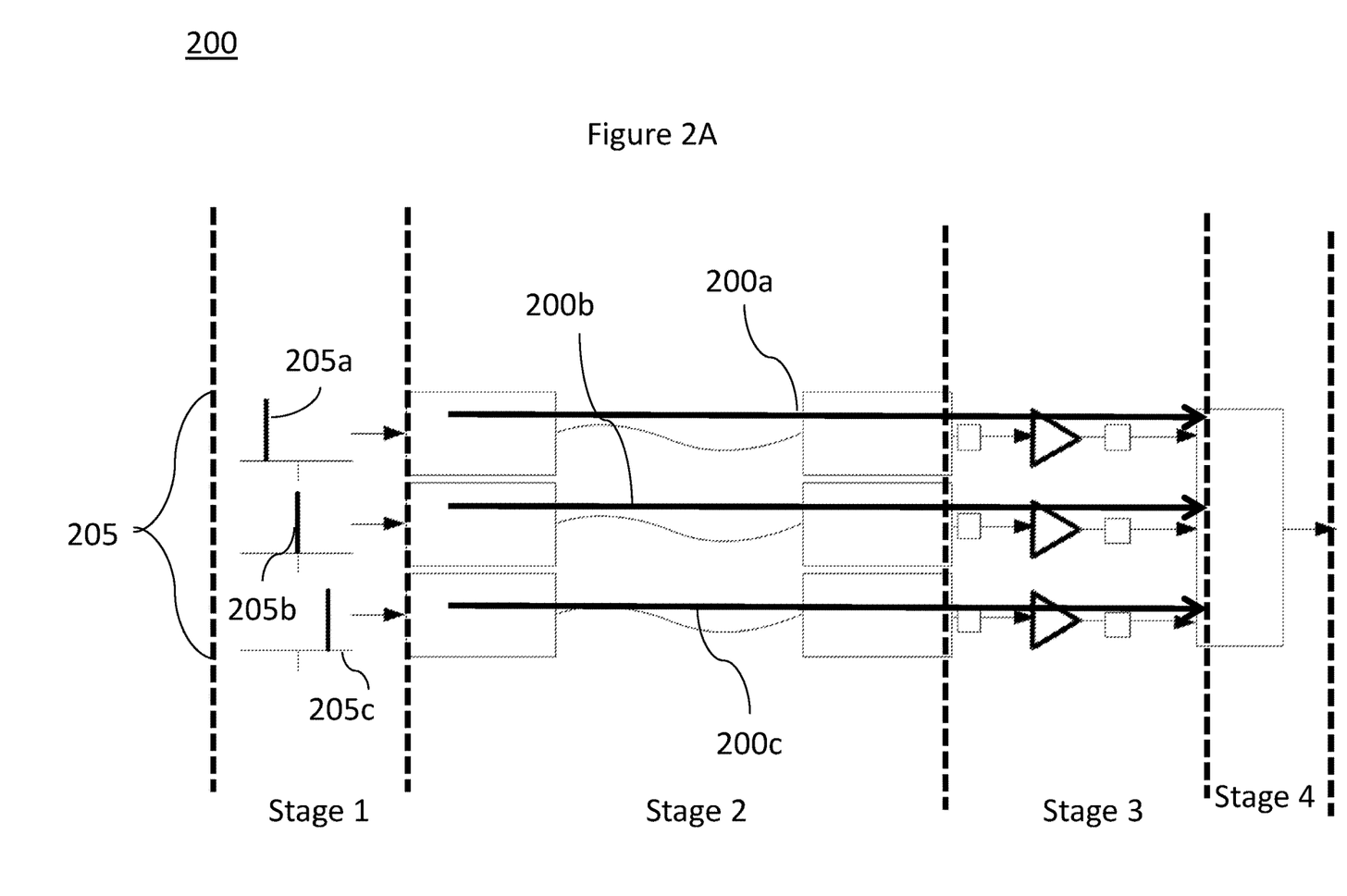
FIG. 2A is a high level diagram of the parallel paths of an embodiment of the transport and amplification system.

FIG. 2A depicts an example transport and amplification system 200 that minimizes the intermodulation by creating parallel transport pathways 200a, 200b and 200c for separate frequencies of an input signal 205. Specifically, the parallel transport pathways 200a, 200b and 200c may minimize intermodulation distortions because two or more frequencies are not present in both active (i.e. electrically powered stages) and passive (i.e. non-powered stages—to a lesser extent but also seen within passive combiners, splitters etc.) stages. Therefore, the parallel transport pathways 200a, 200b and 200c permit the use of a multi-frequency RF input signal 205 with a high strength that improves signal-to-noise ratio without significantly increasing the total distortion.

As shown in FIG. 2A, the transport and amplification system 200 includes a plurality of stages. In Stage 1, separate signals 205a, 205b and 205c are obtained for Multi-frequency Radio Frequency (RF) input signal 205. The input signal 205 may be obtained from a radio basestation signal source so that the signals may already be delivered on separate clean signal paths. In other embodiments, such as a distributed antenna system (DAS), additional circuitry may be required to separate the separate signals 205a, 205b and 205c that are obtained for Multi-frequency RF signal 205. Although three frequencies are depicted, a person of ordinary skill in the art would appreciate that any number of frequencies may be used and any number of parallel transport pathways utilized.

In stage 2, the separate signals 205a, 205b and 205c are injected into the Fiber optic link 220. The separate signals 205a, 205b and 205c are maintained along separate channel pathways in order to improve the signal to noise performance at the output of the link. Then, in stage 3, the separate signals 205a, 205b and 205c are amplified individually. Amplifiers operating in or near saturation mode may be used to deliver very high DC power to analog output signal power inefficiencies. As a result of utilizing the separate parallel transport pathways 200a, 200b and 200c for each separate signal 205a, 205b and 205c, the drive levels can be increased at each stage so as to maximize signal to noise.

Figure 2B:
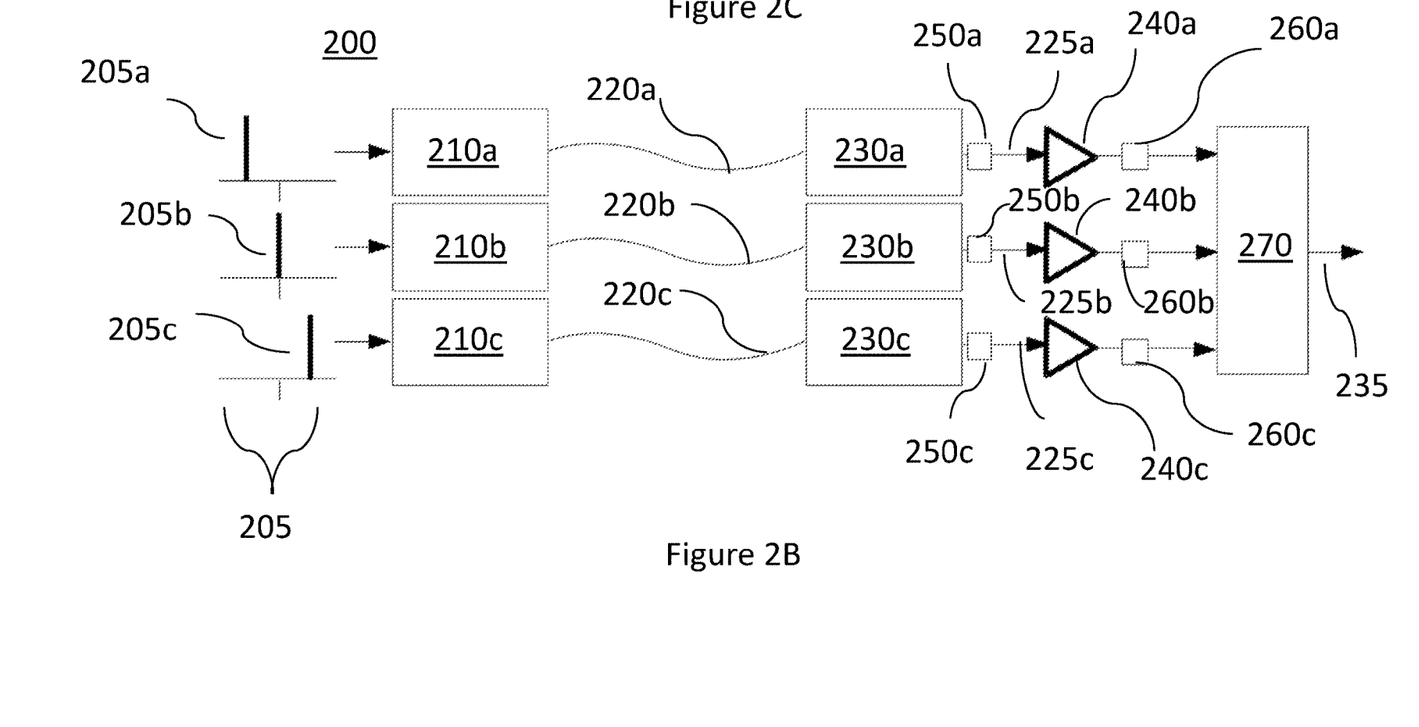
FIG. 2B is a block diagram of an embodiment of the transport and amplification system.
Figure 2C:
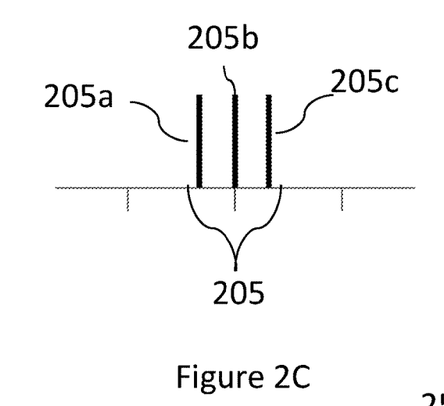
FIG. 2C is a spectral graph of an example multi-frequency input signal.

FIG. 2B depicts a more detailed diagram of the embodiment of a transport and amplification system 200 that can amplify a multi-frequency RF input signal 205 while minimizing the detrimental impacts on an amplified RF signal 235. The multi-frequency RF input signal 205 includes a plurality of signals (205A, 205B and 205C) modulated at discrete frequencies. A spectral graph of the multi-frequency RF input signal 205 is shown in FIG. 2B. Although three frequencies are depicted, a person of ordinary skill in the art would appreciate that any number of frequencies may be used.

The transport and amplification system 200 includes parallel transport pathways 200a, 200b and 200c for each of the plurality of signals 205A, 205B and 205C. Each of the parallel transport pathways 200a, 200b and 200c have a similar configuration, albeit tuned to a different signal. The parallel transport pathways can 200a, 200b and 200c be tuned to a specific frequency or can be broadband to allow for any single frequency over a broad range of frequencies.

The parallel transport pathways 200a, 200b and 200c each include Fiber optic transmitters 210 (210A, 210B and 210C). The Fiber optic transmitter 210 may receive a signal using the specific frequency of the respective parallel transport pathways and ignore any signals received at different frequencies. The Fiber optic transmitter 210 then modulates the received signal over a respective Fiber optic link 220 to a Fiber optic receiver 230 (230a, 230b and 230c). For example, in parallel transport pathway 200b, Fiber optic transmitter 210b receives a signal at the frequency of separate signal 205b, modulates the signal over Fiber optic link 220b, and the modulated signal is received by Fiber optic receiver 230b. The Fiber optic link 220 may be analog or digital fiber optic cable, Ethernet, twisted pair, coaxial or any other cable known in the art. In some embodiments, highly linear fiber optic links may be used to minimize the harmonic and intermodulation distortion. In some embodiments, the Fiber optic transmitters 210 and the Fiber optic receivers 230 may be compliant to the DWDM or CWDM ITU Grid Specification such as ITU-T G.671 or other similar standards which define CWDM and DWDM conventions.

In some embodiments, Fiber optic transmitter 210 converts analog signal 205 into a fiber optic signal in a linear fashion by (for example) intensity modulating a laser diode. The input impedance must be compatible with the output impedance of the previous stage which typically is either 50 ohms or 75 ohms. It is important at this stage that the proper filtering has been performed so that only a single dominant frequency or carrier is present at the input to the fiber optic transmitter. Dominant means that the signal should be at least 30 to 40 dB above any other spurious (although the invention will still operate with lower signal to spurious). The larger the dominance, the better the invention will perform.

The Fiber optic receivers 230 then output the modulated signal from the Fiber optic transmitters 210 along the respective parallel transport pathway 200a, 200b and 200c. The Fiber optic receivers 230 then output analog signals for each frequency in input signal 205 to pre-amp filter 250 (250a, 250b and 250c). For example, in parallel transport pathway 200a, Fiber optic receiver 230a outputs an analog signal at the frequency of separate signal 205a to pre-amp filter 250a.

The pre-amp filter 250 may be a band pass filter that removes all frequencies, other than the specific frequency of the input signal 205 that generated the modulated signal, to generate filtered analog signal 225 (225a, 225b and 225c). For example, pre-amp filter 250c may remove all frequencies other than 205c to generate filtered analog signal 225c. Without the proper filtering, spurious signals will cause significant intermodulation and will negate the efficiency of the amplifiers 240. It is important for the amplifier to be compatible with the frequency of operation and the desired signal levels. It is critical to select the proper amplifier for the frequency band and to provide impedance matching as required. As a result, pre-amp filter 250 may filter out the harmonic distortion and prepare it for amplification. In some embodiments, saw or crystal filters, ADC's/digital signal processors/DAC's, or other filtering techniques may be used.

The filtered analog signal is then received by a corresponding amplifier 240 (240a, 240b and 240c) along the respective parallel transport pathway 200a, 200b and 200c. The amplifier 240 may then amplify the filtered analog signal 225 at the specific frequency of the respective parallel transport pathway 200a, 200b and 200c to a level required by the application. For example, in parallel transport pathway 200a, amplifier 240a may amplify filtered analog signal 225a at the frequency of separate signal 205a. The amplifiers 240 may be high efficiency single frequency amplifiers operating near or beyond the 1 dB compression point. The amplifiers 240 may also be a chain of amplifiers with filters in between stages so as to amplify the signal to the appropriate levels and properly and effectively remove the harmonic spurious signals.

The signal amplified by the amplifiers 240 may then pass through final filters 260 (260a, 260b and 260c) along the respective parallel transport pathway 200a, 200b and 200c. The final filters 260 may be a band pass, low pass, or high pass filter. The final filters may be matched to specific frequency of the filter signal. For example, final filter 260a may permit the frequency of separate signal 205a to pass. In addition, that eliminates the harmonic spurious signals generated by the amplifiers 240. The final filters 260 may match the amplifier output to the proper system, such as 50 or 75 ohm.

Figure 5:
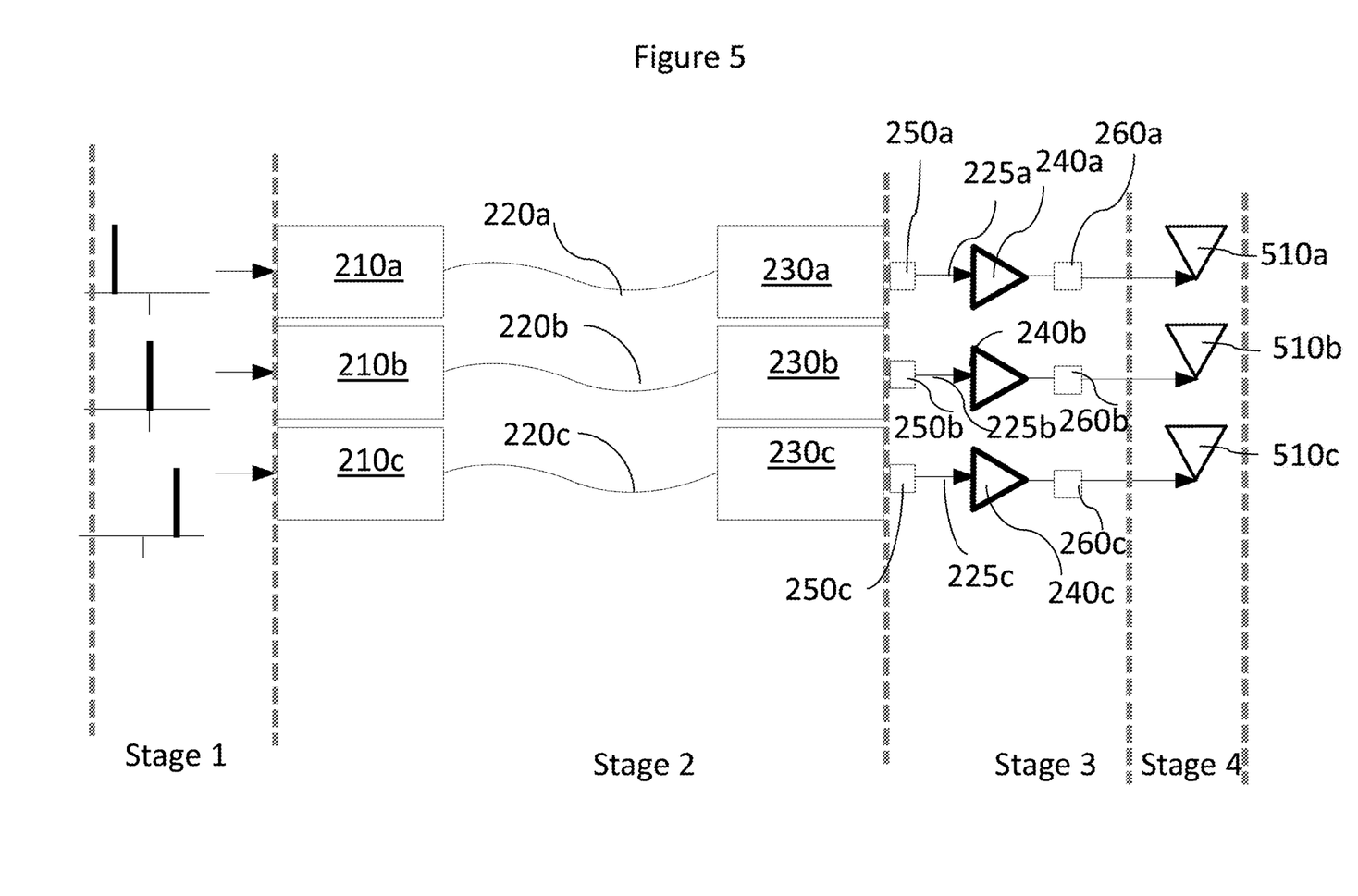
FIG. 5 is an example of another embodiment that uses multiple transmit antennae.

A combiner 270 may then receive the outputs of the final filters 260 to generate amplified RF signal 235. The combiner 270 may be a passive low distortion combiner. The combiner 270 may permit the use of a single antenna where free-space transmission is required with a single multi-frequency antenna. However, in alternate embodiments (such as shown in FIG. 5), the combiner 270 may be omitted, and multiple antennae may be used.

In some embodiments, the combiner 270 may be a multistage combiner. For example, a first stage of the combiner may combine frequencies within a relatively narrow band. A second stage of the combiner 270 then may utilize "cross-band" combiners that allow widely spaced frequency groups to be combined with very low loss. For example, a group of VHF signals can be cross-band combined with a group of UHF signals with 1 dB or less attenuation per band. Alternatively, in place of the combiner and a single antenna, the combiner can be eliminated, and individual antenna can be used on each amplifier and low pass filter output.

Figure 2D:
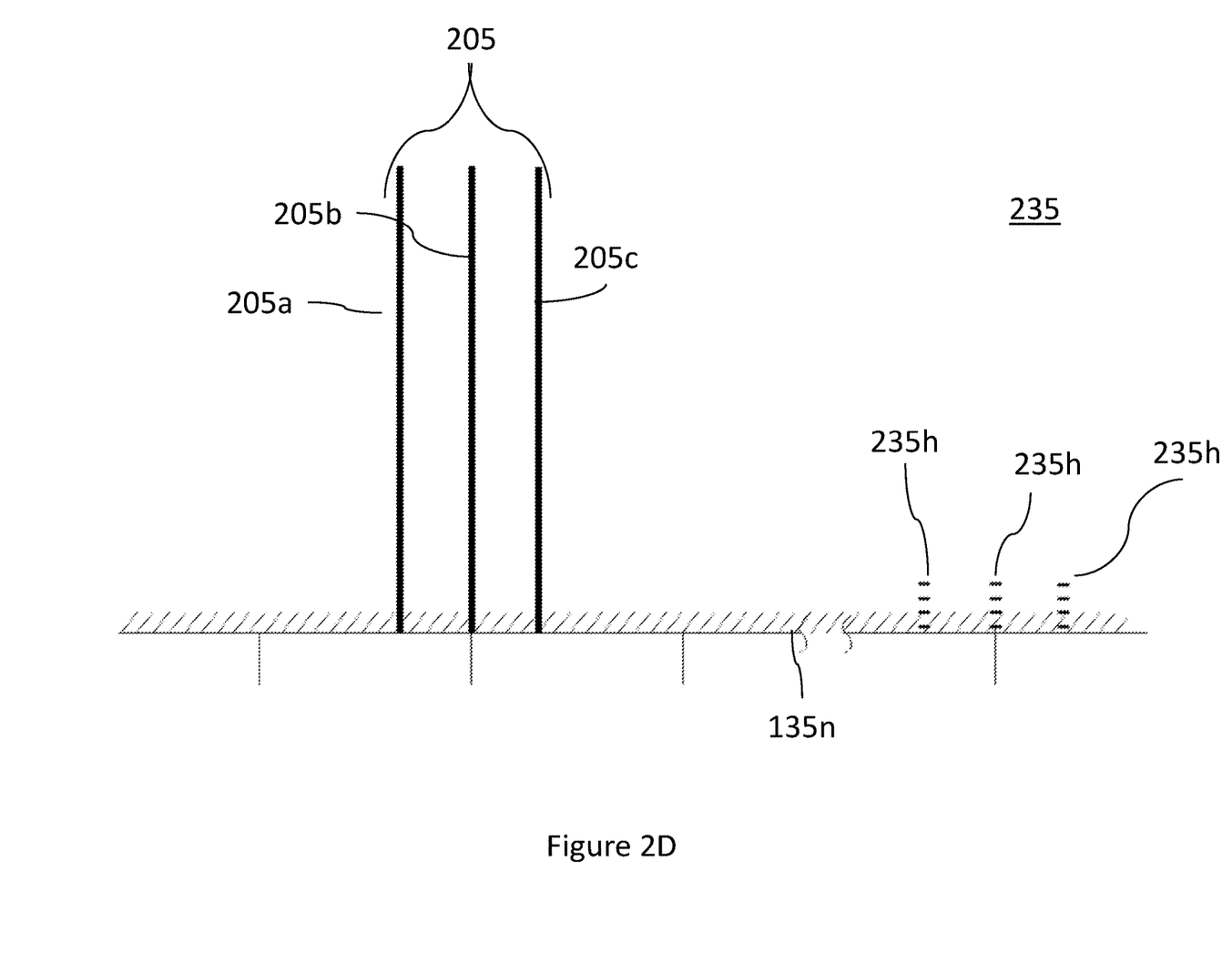
FIG. 2D is a spectral graph of an example output of the embodiment of transport and application system.

FIG. 2D depicts a spectral graph of the amplified RF signal 235. The amplified RF signal 235 includes combination of the multi-frequency RF input signal 205 harmonic distortions 135h and additional noise 135n. As shown in the FIG. 2D, the intermodulation distortions 135i of FIG. 1C have been eliminated, and amplitude of the harmonic distortion 235h have been dramatically reduced. As a result, transport and amplification system 200 reduces the unwanted signals that interfere, distort and otherwise detrimentally impact the clear transmission produced by transport and amplification system 100.

Figure 3:
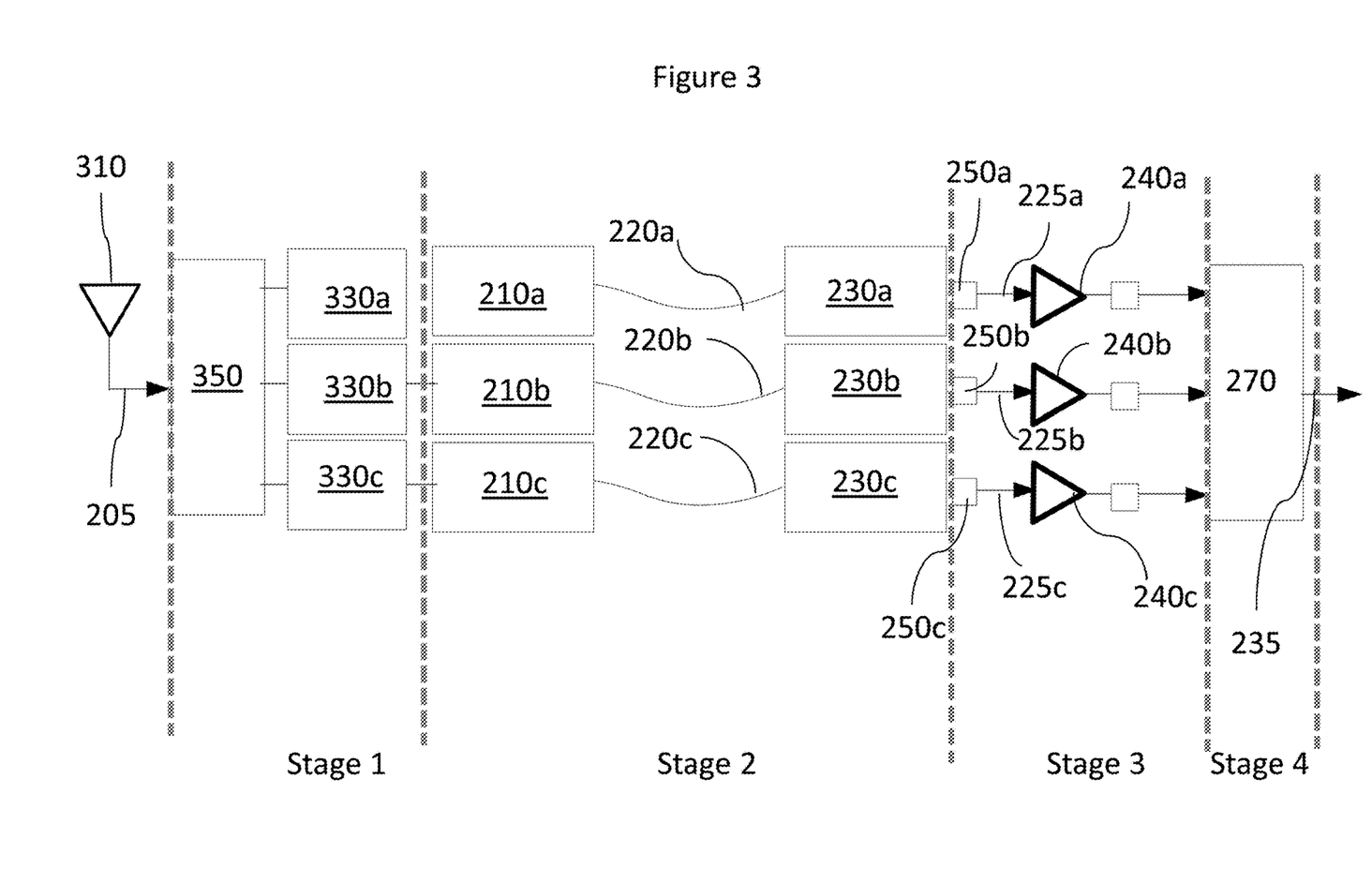
FIG. 3 is an example of an embodiment that receives a multi-frequency input signal using an antenna.

FIG. 3 depicts an embodiment of transport and amplification system 200 where the Multi-frequency RF signal 205 is obtained using antennae 310. Although one antenna 310 is depicted, a person of ordinary skill would appreciate that an array of antennae may also be used. In stage 1, the antenna 310 transmits the Multi-frequency RF signal 205 to a splitter 350. The splitter 350 provides the Multi-frequency RF signal 205 in parallel to narrow band pass filters 330 (330a, 330b, 330c). The narrow band pass filters 330 separate the RF signal 205 into the separate signal 205a, 205b and 205c by allowing only a single frequency to pass. The number of narrow band pass filters 330 utilized corresponds to the number of independent signals carried by the Multi-frequency RF signal 205. Although three narrow band pass filters 330 are depicted, a person of ordinary skill in the art would appreciate that any number of narrow band pass filters can be used. The narrow band pass filters 330 allow each separate signal 205a, 205b and 205c to pass to the corresponding Fiber optic transmitter 210. For example, in parallel transport pathway 200a, the narrow band pass filter 330a allows signal 205a to pass to Fiber optic transmitter 210a. Once the Fiber optic transmitter 210 receives each separate signal 205a, 205b and 205c, stages 2-4 of transport and amplification system 200 operate as described above.

Figure 4:
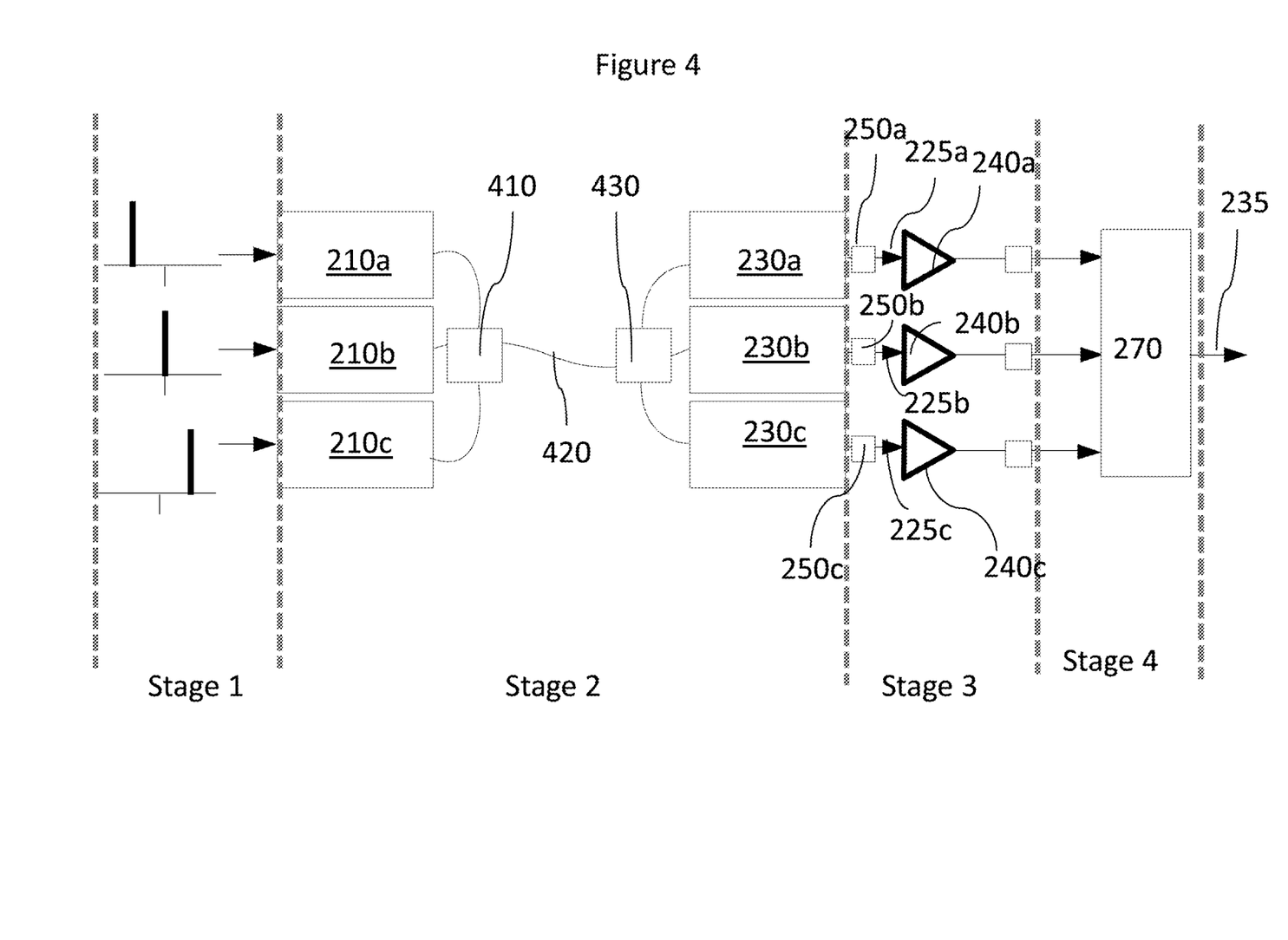
FIG. 4 is an example of another embodiment that uses a multiplexer and de-multiplexer.

Another embodiment of transport and amplification system 200 is depicted in FIG. 4. In stage 2 of this embodiment, a Multiplexer 410 receives the modulated signal from the Fiber optic transmitters 210. The Fiber optic transmitters 210 may use Wavelength Division Multiplexing (WDM) or other known multiplexing techniques known in the art. The modulated signal from the Fiber optic transmitters 210 may have tuned wavelength outputs corresponding to the filter passbands of the Multiplexer 410. The Multiplexer 410 outputs a multiplexed signal over a single fiber strand 420. A de-multiplexer 430 received the multiplexed signal from the single fiber strand 420. The de-multiplexer 430 may have matched tuned optical filters to extract the individual optical channels corresponding to separate signal 205a, 205b and 205c. The output of the de-multiplexer is transmitted to Fiber optic receivers 230 (230a, 230b and 230c). Once the Fiber optic receivers 230 receive the signal corresponding to separate signal 205a, 205b and 205c for each of the parallel transport pathways 200a, 200b and 200c, stages 3 and 4 of transport and amplification system 200 operate as described above.

FIG. 5 depicts an embodiment where in stage 4 of transport and amplification system 200, the Combiner 270, is replaced by antennas 510 (510a, 510 and 510c). In this embodiment, each parallel transport pathway 200a, 200b and 200c has an associated antenna 510. Each respective antenna 510 receives the output from the corresponding final pass filter 260 along the parallel transport pathways 200a, 200b and 200c. The antennas 510 then propagate the amplified RF signal 235 as an electromagnetic wave.

Figure 6:
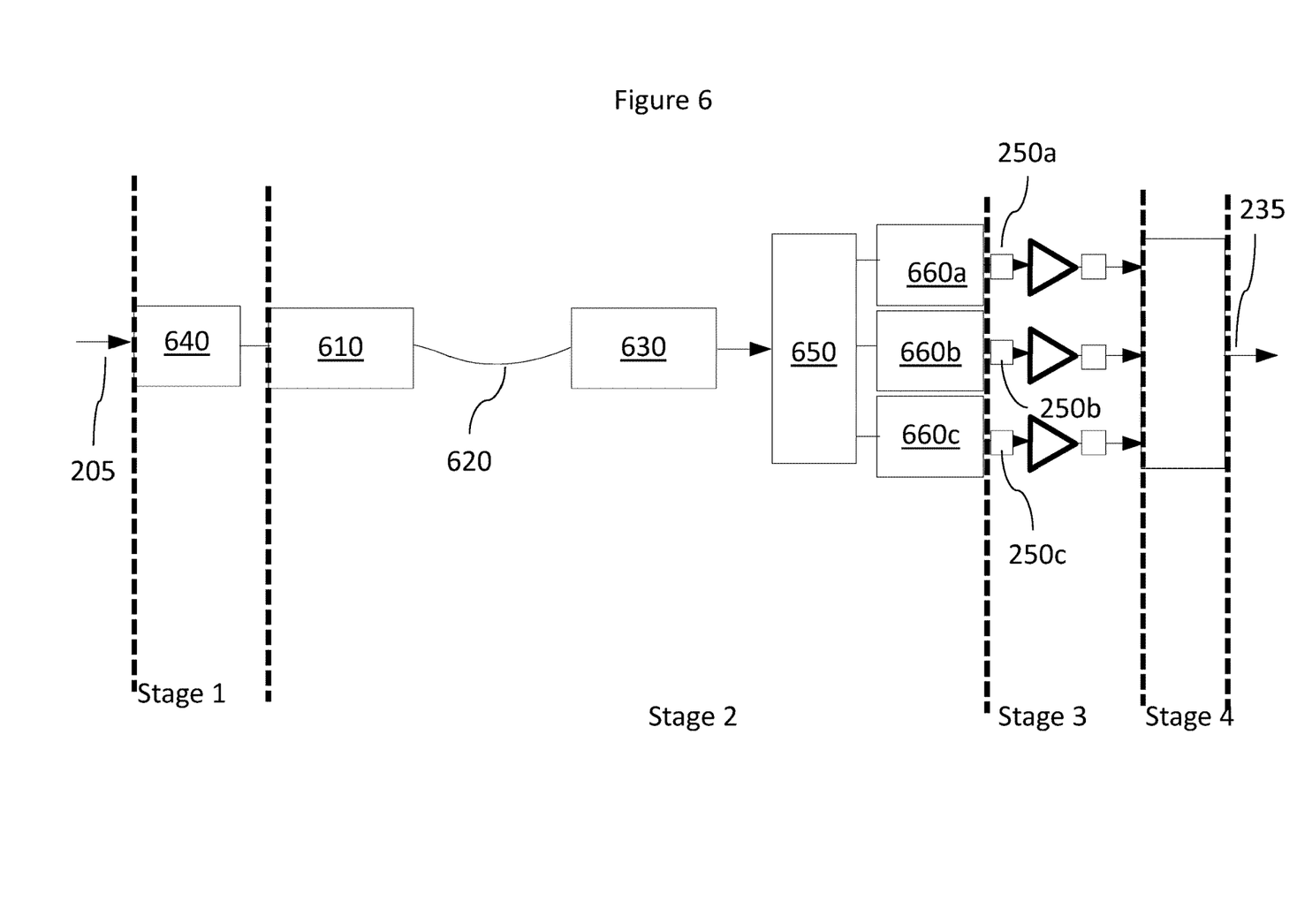
FIG. 6 is an example of another embodiment that uses a digital connection.

FIG. 6 depicts an embodiment of transport and amplification system 200 that utilizes digital transmission. In stage 1 of this embodiment, an Analog to Digital Converter (ADC) 640 converts the Multi-frequency RF input signal 205 to a digital signal. In stage 2, the digital signal is received by an optical transmitter 610, and the optical transmitter 610 then transmits an optical signal over a fiber optical cable strand 620. A fiber optic receiver 630 then receives the optical signal from the fiber optical cable strand 620 and converts the signal from optical back to an electrical signal. In some embodiments, the levels at the input of the optical transmitter 610 would be similar to the levels at the output of the fiber optic receiver 630. In the case of an analog or RF fiber optic link, the levels at the output of the receiver are lower, and additional gain stages can be added to boost the signal at the output of the fiber optic receiver 630. The signal from the fiber optic receiver 630 is output to a Digital Signal Processor (DSP) 650. The DSP 650 extracts digital equivalents of separate signals 205*a*, 205*b* and 205*c* from the received signal. The DSP then transmits the digital equivalents of separate signals 205*a*, 205*b* and 205*c* to Digital to Analog Converters (DAC) 660 (660*a*, 660*b* and 660*c*). The DAC 660 then outputs an analog signal to respective preamplifiers 250 for each of the parallel transport pathways 200*a*, 200*b* and 200*c*. Stages 3 and 4 of transport and amplification system 200 then proceed as described above.

Figure 7:
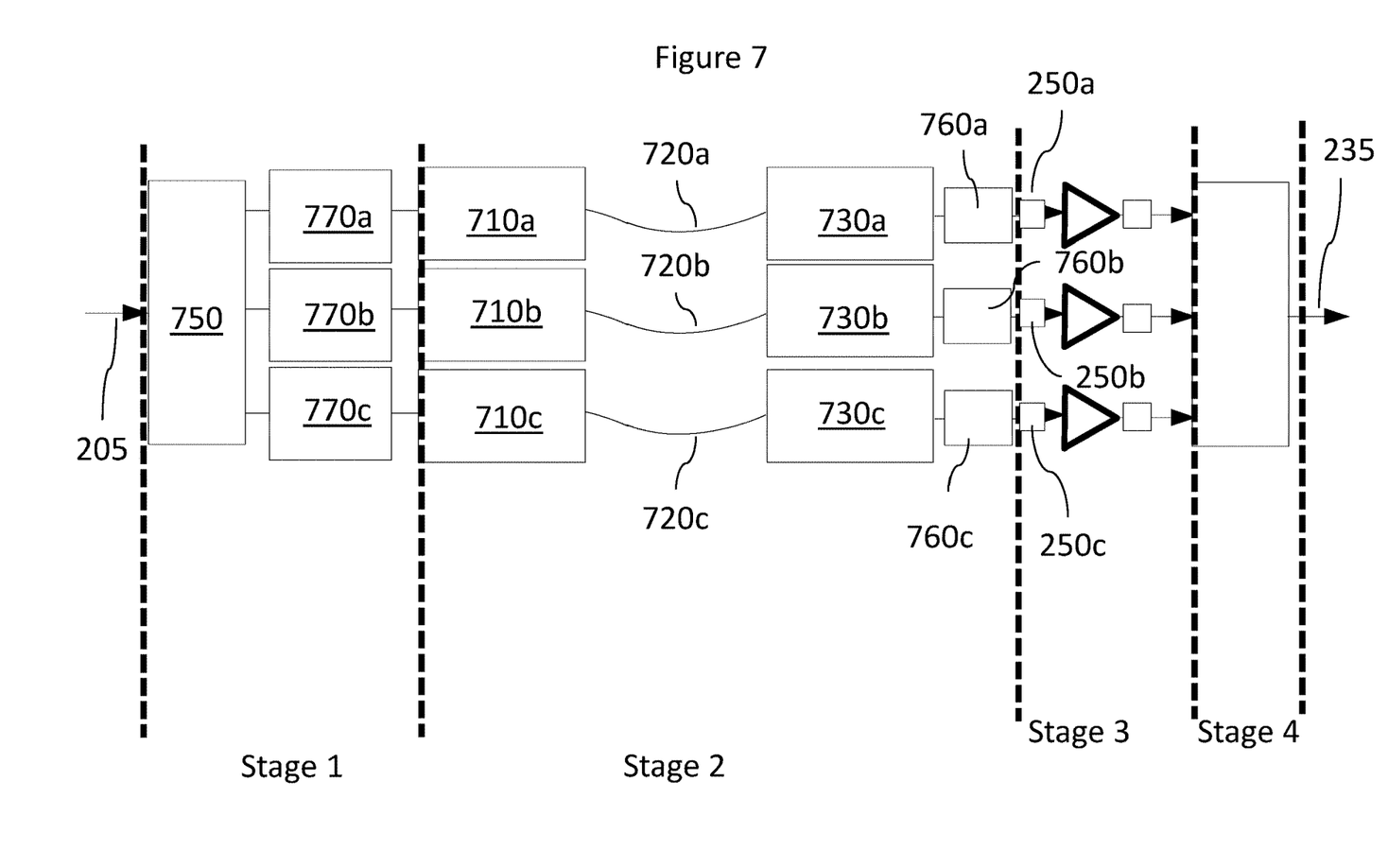
FIG. 7 is an example of another embodiment that uses a digital connection.

FIG. 7 depicts an embodiment of transport and amplification system 200 where stage 1 and stage 2 utilize digital signals. In stage 1 of this embodiment, a splitter 750 receives the multi-frequency RF input signal 205. The splitter 750 then transmits the multi-frequency RF input signal 205 in parallel to an array of ADC 770 (770*a*, 770*b*, 770*c*). The number of ADC 770 may correspond to the number of parallel transport pathways 200*a*, 200*b* and 200*c* in the transport and amplification system 200. Each ADC 770 then extracts respective separate signals 205*a*, 205*b* and 205*c* and outputs the digital equivalence of the extracted separate signal to a respective optic transmitter 710 (710*a*, 710*b* and 710*c*). Each of the optic transmitters 710 transmit digital equivalence of the extracted separate signal over a fiber optical channel 720 (720*a*, 720*b* and 720*c*). In some embodiments, each parallel communication pathway may have a dedicated fiber optic channel 720. In other embodiments, an optical multiplexer 410 may be used.

The fiber optic receivers 730 (730*a*, 730*b* and 730*c*) receive the digital equivalent of the respective separate signals 205*a*, 205*b* and 205*c* fiber optical cable strand. The digital equivalence of the respective separate signals 205*a*, 205*b* and 205*c* is then sent in parallel to an array of DAC 760. The DAC 760 then outputs an analog signal to respective pre-amplifiers 250 for each of the parallel transport pathways 200*a*, 200*b* and 200*c*. Stages 3 and 4 of transport and amplification system 200 then proceed as described above. In some embodiments, the DAC 760 may include a Digital Signal Processor (DSP) or a Field Programmable Gate Array (FPGA) that applies additional narrowband digital filters which eliminate the unwanted spurious signals and isolate one desired frequency as the dominant signal for each parallel transport pathways 200*a*, 200*b* and 200*c*.

Figure 8:
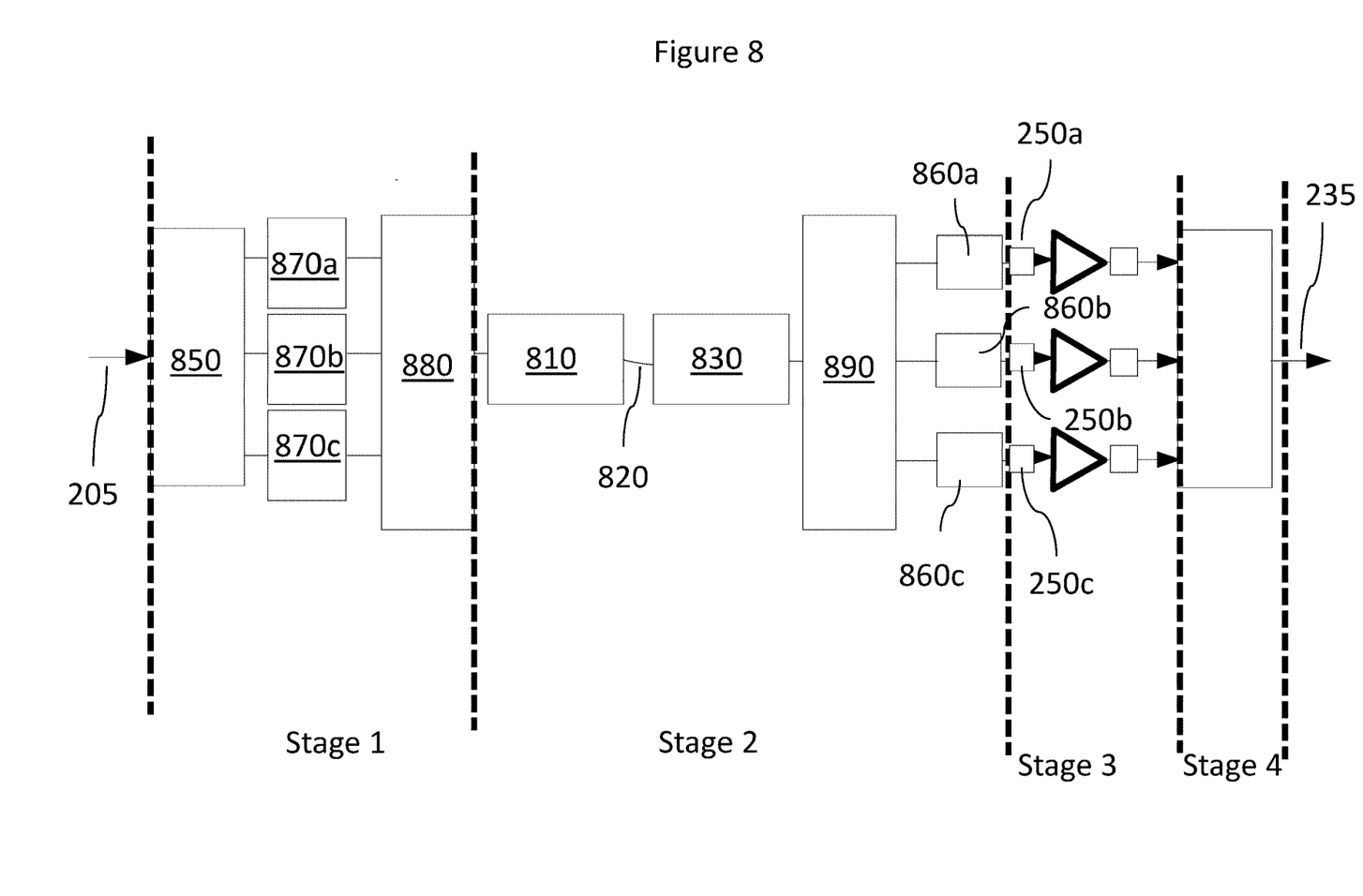
FIG. 8 is an example of another embodiment that uses a digital connection.

FIG. 8 shows another embodiment that utilizes a signal digital communication channel. In stage 1 of this embodiment, a splitter 850 receives the multi-frequency RF input signal 205. The splitter 850 then transmits the multi-frequency RF input signal 205 in parallel to an array of ADC 870 (870*a*, 870*b*, 870*c*). The number of ADC 870 may correspond to the number of parallel transport pathways 200*a*, 200*b* and 200*c* in the transport and amplification system 200. Each ADC 870 then extracts respective separate signals 205*a*, 205*b* and 205*c* and outputs the digital equivalence of the extracted separate signals to a Parallel to Serial Converter 880. The Parallel to Serial Converter 880 multiplexes digital equivalence of the extracted separate signals. The multiplexed single digital stream output by the Parallel to Serial Converter may be composed of interlaced bits of the extracted separate signals. The multiplexed single digital stream is converted into a serial optic data stream by Digital Fiber Optic Transmitter 810. The Digital Fiber Optic Transmitter 810 transmits the serial optic data stream over fiber optic cable 820 to a Digital Fiber Optic Receiver 830. The Digital Fiber Optic Receiver 830 then receives the incoming serial stream of data and converts it to a serial electrical digital signal. The Digital Fiber Optic Receiver 830 then transmits the serial electrical digital signal to a Serial to Parallel converter 890. Even though the signals are combined into a single stream, since they are transmitted as a digital signal, they do not detrimentally interact creating intermodulation distortion or excess noise in the way the active analog combining would.

The Serial to Parallel converter 890 multiplexes the serial signal back into the parallel data streams. The number of data streams corresponds to the number of parallel transport pathways 200*a*, 200*b* and 200*c*. The parallel data streams are then sent in parallel to an array of DAC 860 (860*a*, 860*b* and 860*c*). The DAC 860 then outputs an analog signal to respective pre-amplifiers 250 for each of the parallel transport pathways 200*a*, 200*b* and 200*c*. Stages 3 and 4 of transport and amplification system 200 then proceed as described above.

Figure 9:
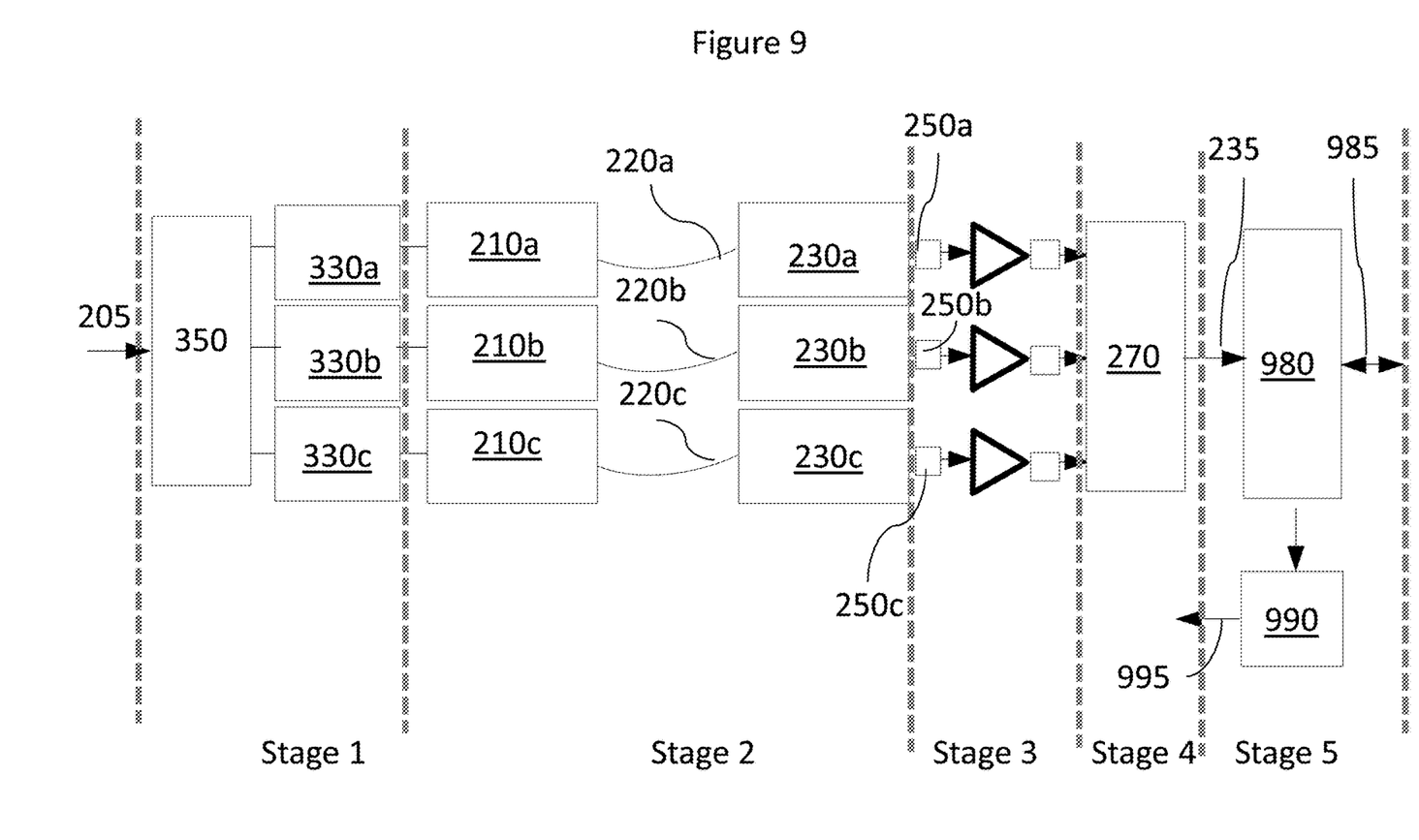
FIG. 9 is an example of a bi-directional embodiment.

A bi-directional embodiment is depicted in FIG. 9. In this embodiment, an additional fifth stage is added to the transport and amplification system 200. In stage 5 of this embodiment, the amplified RF signal 235 is output to a duplexer 980. The duplexer 980 transmits the amplified output signal via duplexed signal 985. The duplexer 980 also receives an inbound data signal from the duplexed signal 985. The duplexer 980 then transmits the inbound data signal to a receiver 990. The receiver then transports the uplink signal back to the Stage 1 for processing.

The design presented herein and the specific aspects illustrated are meant not to be limiting, but may include alternate components while still incorporating the teachings and benefits of the invention. While the invention has thus been described in connection with specific embodiments thereof, it will be understood that the invention is capable of further modifications. For example, components from one embodiment may be combined and substituted for components in other embodiments. This application is intended to cover any variations, uses or adaptations of the invention following, in general, the principles of the invention, and including such departures from the present disclosure as come within known and customary practice within the art to which the invention pertains.

What is claimed is:

1. A system for amplifying a multi-frequency radio signal, the system comprising:
    a receiver that receives the multi-frequency radio signal;
    a splitter communicatively coupled to the receiver;
    a plurality of parallel transport pathways communicatively coupled to the splitter, wherein each of the parallel transport pathways transports a particular signal at a particular frequency that is included in the multi-frequency radio signal;
    wherein each of the parallel transport pathways includes:
    a first filter that allows only the particular signal at the particular frequency to pass,
    an optical transmitter that receives the particular signal at the particular frequency passed by the first filter, converts the particular signal to an optical signal and transmits the optical signal via optical cabling,
    an optical receiver that receives the optical signal from the optical cabling and converts the optical signal to an analog signal,
    an amplifier that receives the analog signal and generates an amplified signal at the particular frequency.

2. The system of claim 1, wherein each of the parallel transport pathways further include a separate optical fiber, and
    the optical transmitter transmits the optical signal over the separate optical fiber.

3. The system of claim 1, further comprising:
    a multiplexer, wherein the multiplexer:

receives the optical signal from each of the parallel transport pathways, multiplexes each optical signal received from each of the parallel transport pathways to generate a multiplexed signal, and transmits the multiplexed signal via the optical cabling.

4. The system of claim 3, further comprising:

a de-multiplexer, wherein the de-multiplexer:

receives the multiplexed signal from optical cabling, de-multiplexes the multiplexed signal to recover the optical signal, and provides the optical signal to optical receiver of each of the parallel transport pathways.

5. The system of claim 1, wherein each of the parallel transport pathways further includes:

a second filter, wherein the second filter:

receives the analog signal from the optical receiver, and generates a second filtered signal by removing all components of the analog signal not at the particular frequency;

wherein the amplifier generates the amplified signal at the particular frequency based on the second filtered signal.

6. The system of claim 5, wherein each of the parallel transport pathways further includes:

a third filter, wherein the third filter:

receives the amplified signal, and generates a third filtered signal by removing all components of the amplified signal not at the particular frequency.

7. The system of claim 1, further comprising:

a combiner, wherein the combiner:

receives the amplified signal from each of the parallel transport pathways, combines the amplified signal received from each of the parallel transport pathways to generate a combined signal, and transmits the combined signal.

8. The system of claim 1, wherein each of the parallel transport pathways further includes:

an antenna, wherein the antenna:

receives the amplified signal from the amplifier, and radiates the amplified signal.

9. The system of claim 1, wherein each of the parallel transport pathways further includes:

an analog to digital converter (ADC), wherein the ADC:

converts the multi-frequency radio signal into a digital signal, and transmits the digital signal to the optical transmitter; and wherein the optical transmitter transmits the digital signal as the optical signal.

10. The system of claim 9, wherein the optical receiver includes:

a digital to analog convert (DAC), wherein the DAC:

receives the digital signal, and generates the analog signal based on the digital signal received.

11. A method for transmitting a multi-frequency radio signal, the method comprising:

receiving the multi-frequency radio signal;

separating the multi-frequency radio signal into a plurality of separate radio signals based on a unique frequency of each separate radio signal;

converting, in parallel, each of the plurality of radio signals into a respective optical signal;

transmitting, in parallel, each respective optical signal via optical cabling;

receiving, in parallel, each respective optical signal from the optical cabling;

converting, in parallel, each respective optical to a respective analog signal;

amplifying, in parallel, each respective analog signal to generate a plurality of amplified signals; and radiating the plurality of amplified signals.

12. The method of claim 11, wherein each respective optical signal is transmitted via a separate optical fiber.

13. The method of claim 11, wherein the transmitting includes:

multiplexing each respective optical signal to generate a multiplexed signal; and transmitting the multiplexed signal via the optical cabling.

14. The method of claim 13, wherein the receiving includes:

de-multiplexing the multiplexed signal to recover each respective optical signal.

15. The method of claim 11, wherein the amplifying includes:

passing, in parallel, each respective analog signal through a respective first filter to generate respective first filtered signals, wherein the respective first filter allows only the unique frequency of the respective analog signal to pass; and generating, in parallel, the plurality of amplified signals based on the respective first filtered signals.

16. The method of claim 15, wherein the generating includes:

amplifying, in parallel, each of the respective filtered signals, to generate respective amplified filter signals;

passing, in parallel, each respective each of the amplified filtered signals through a respective second filter to generate respective second filtered signals, wherein the respective second filter allows only the unique frequency of the respective analog signal to pass; and generating, in parallel, the plurality of amplified signals based on the respective second filtered signals.

17. The method of claim 11, wherein the radiating includes:

combining the plurality of amplified signals into a combined signal; and radiating the combined signal.

18. The method of claim 11, wherein the radiating includes:

independently radiating, in parallel, each of the plurality of amplified signals.

19. The method of claim 11, wherein the separating includes:

converting, the multi-frequency radio signal into a digital signal; and separating, the digital signal into a plurality of separate digital signals that correspond to the separate radio signals.

20. The method of claim 19, wherein the converting includes:

multiplexing plurality of separate digital signals to generate a multiplexed signal; and transmitting the multiplexed signal via the optical cabling.

* * * * *